(12) United States Patent
Blödt et al.

(10) Patent No.: US 11,054,512 B2
(45) Date of Patent: Jul. 6, 2021

(54) FREQUENCY CONVERTER CIRCUIT FOR A RADAR-BASED MEASURING DEVICE

(71) Applicant: Endress+Hauser GmbH+Co. KG, Maulburg (DE)

(72) Inventors: Thomas Blödt, Steinen (DE); Peter Klöfer, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 343 days.

(21) Appl. No.: 16/335,406

(22) PCT Filed: Aug. 24, 2017

(86) PCT No.: PCT/EP2017/071351
§ 371 (c)(1),
(2) Date: Mar. 21, 2019

(87) PCT Pub. No.: WO2018/054649
PCT Pub. Date: Mar. 29, 2018

(65) Prior Publication Data
US 2019/0271773 A1    Sep. 5, 2019

(30) Foreign Application Priority Data
Sep. 22, 2016    (DE) ............... 10 2016 117 920.5

(51) Int. Cl.
*G01S 13/34*    (2006.01)
*G01F 23/284*   (2006.01)
(Continued)

(52) U.S. Cl.
CPC ............ *G01S 13/34* (2013.01); *G01F 23/284* (2013.01); *G01S 7/35* (2013.01); *G01S 7/352* (2013.01);
(Continued)

(58) Field of Classification Search
CPC .. G01S 13/34; G01S 13/88; G01S 2007/4013; G01S 7/282; G01S 7/35;
(Continued)

(56) References Cited

U.S. PATENT DOCUMENTS 3,716,854 A * 2/1973 Chariot, Jr. ............. G01S 13/10
                                                  342/27
4,847,623 A * 7/1989 Jean ....................... G01F 23/284
                                                  342/124
(Continued)

FOREIGN PATENT DOCUMENTS

DE    102005058015 A1    6/2007
DE    102011078060 A1    12/2012
(Continued)

OTHER PUBLICATIONS

Search Report for German Patent Application No. 10 2016 117 920.5, German Patent Office, dated Jul. 4, 2017, 7 pp.
(Continued)

*Primary Examiner* — Olumide Ajibade Akonai
(74) *Attorney, Agent, or Firm* — Mark A. Logan; Endress+Hauser (USA) Holding Inc.

(57) ABSTRACT

The invention relates to a frequency converter circuit for a radar-based distance-measuring device. The core of the frequency converter circuit is a non-linear, high-frequency component, having a frequency connection point and a signal connection point, which serves as a signal input for a low-frequency input signal. On the reception side, the frequency converter circuit comprises at least one receiving antenna for receiving the high-frequency reception signal and a non-linear semiconductor component for downconverting the high-frequency reception signal. The frequency converter circuit therefore uses the effect that, by means of the low-frequency input signal, corresponding harmonic waves are induced at the non-linear, high-frequency com-
(Continued)

ponent. Furthermore, the high-frequency reception signal is downconverted into a low-frequency evaluation signal, whereby the further determination of the distance can be performed on the basis of the low-frequency evaluation signal, which can be processed more easily.

16 Claims, 4 Drawing Sheets

(51) Int. Cl.
- *G01S 7/35* (2006.01)
- *H03K 5/00* (2006.01)
- *G01S 7/03* (2006.01)
- *G01S 7/282* (2006.01)

(52) U.S. Cl.
CPC .......... *H03K 5/00006* (2013.01); *G01S 7/032* (2013.01); *G01S 7/282* (2013.01)

(58) Field of Classification Search
CPC ........ G01S 7/352; G01S 7/4008; G01S 7/032; G01S 13/56; G01S 7/03; G01S 13/103; G01S 7/2813; G01F 23/284; H01Q 13/02; H01Q 1/225; H03K 5/00006
See application file for complete search history.

(56) References Cited

U.S. PATENT DOCUMENTS

| | | | |
|---|---|---|---|
| 5,659,321 A * | 8/1997 | Burger | G01F 23/284 342/124 |
| 6,097,331 A * | 8/2000 | Matsugatani | G01S 7/35 342/109 |
| 7,605,748 B2 * | 10/2009 | Fehrenbach | G01F 23/284 342/123 |
| 8,509,684 B2 * | 8/2013 | Funae | H04B 1/10 455/20 |
| 2006/0055585 A1 * | 3/2006 | Nagasaku | G01S 13/347 342/28 |
| 2012/0036927 A1 * | 2/2012 | Sanders | G01F 23/02 73/291 |
| 2018/0372527 A1 * | 12/2018 | Griessbaum | G01F 23/284 |

FOREIGN PATENT DOCUMENTS

| | | |
|---|---|---|
| JP | 2003194918 A | 7/2003 |
| WO | 0045460 A2 | 8/2000 |
| WO | 00127861 A2 | 4/2001 |

OTHER PUBLICATIONS

International Search Report for Patent Application No. PCT/EP2017/071351, WIPO, dated Nov. 3, 2017, 36 pp.

* cited by examiner

FREQUENCY CONVERTER CIRCUIT FOR A RADAR-BASED MEASURING DEVICE

CROSS-REFERENCE TO RELATED APPLICATIONS

The present application is related to and claims the priority benefit of German Patent Application No. 10 2016 117 920.5, filed on Sep. 22, 2016 and International Patent Application No. PCT/EP2017/071351, filed on Aug. 24, 2017, the entire contents of which are incorporated herein by reference.

TECHNICAL FIELD

The invention relates to a frequency converter circuit for a radar-based measuring device, which is used to determine the distance to a measurement object or to determine the speed thereof.

BACKGROUND

Radar-based distance and velocity measurement is used in a broad range of applications, e.g., for position determination in aviation, for distance or velocity measurement in motor vehicles, or for determining the fill-level in process automation.

In principle, two different radar technologies according to the prior art can be used for this purpose: on the one hand, FMCW (frequency-modulated continuous wave, also known as continuous wave radar), or the so-called pulse propagation method. Both methods are carried out within predefined radar frequency bands (electromagnetic waves with frequencies between 0.3 GHz and 300 GHz are considered radar waves within the scope of this patent application).

In the case of radar-based fill-level measurement, the work is performed in radar frequency bands at 6 GHz, 26 GHz, or 79 GHz. The higher frequency bands are preferred, since a greater absolute bandwidth can be used in these cases. This in turn allows a higher measuring accuracy. Particularly in fill-level measurement, this constitutes an important requirement, because, in this case—especially, with large containers—as accurate a knowledge as possible of the fill-level (L) is required. A further advantage of using high frequencies is that smaller antennas (and thus also smaller connection flanges for attachment to the container) can be used, without reducing the bundling effect of the antenna.

It is therefore desirable to generally carry out fill-level measurement or distance or velocity measurement at frequencies higher than 79 GHz (up to very high radar frequencies up to 300 GHz). Above 60 GHz, it is, however, increasingly difficult to process the high-frequency transmission and reception signals, in terms of signaling, within the measuring device. The reason for this lies in the increased sensitivity to interference and the increasing absorption of the signals.

An approach for generating very-high-frequency radar transmission signals (Txh) for applications in fill-level measurement is described in published patent application DE 10 2011 078 060 A1: The transmitting circuit shown there is arranged on a circuit board and is based upon a high-frequency transistor. In this case, the high-frequency transistor is excited by an oscillator, e.g., a crystal oscillator, at a low frequency, in the one-digit or two-digit GHz range. As a result of a corresponding connection of the transistor, a high-frequency electrical harmonic signal is generated at its output, wherein the harmonic frequency corresponds to an integer multiple of the low-frequency oscillator frequency. The transistor-generated high-frequency harmonic signal may subsequently be coupled out via a transmitting antenna so that a high-frequency radar transmission signal (Txh) is emitted. The circuit described in DE 10 2011 078 060 A1 thereby offers the advantage that the high-frequency transmission signal (Txh) can be emitted via the transmitting antenna without further processing on the circuit board, and thus in a very low-loss manner.

The high-frequency transmission signal ($Tx_h$) is subsequently reflected on the measurement object, whose distance (d) to the measuring device or whose speed is to be determined, and received as high-frequency reception signal ($Rx_h$) by the measuring device. The frequency of the reception signal ($Rx_h$) corresponds to the frequency of the high-frequency transmission signal ($Tx_h$).

In contrast to the transmission signal (Txh), however, the reception signal (Rxh) must be processed with the existing high frequency, in the approach disclosed in DE 10 2011 078 060 A1. As a result, the highest possible frequency of the reception signal (Rxh), and thus also the frequency of the transmission signal (Txh), is limited in practice to values up to about 60 GHz (and, by accepting various disadvantages, such as diminished measuring accuracy and limitation to highly reflective filling material surfaces, up to 100 GHz).

SUMMARY

The aim of the invention is therefore to enable a radar-based distance or velocity measuring device which can operate with very high radar frequencies.

The invention achieves this aim by a frequency converter circuit for a radar-based measuring device, which serves to determine the distance (d) to a measurement object or to determine the speed thereof. For this purpose, it comprises:
  a non-linear, high-frequency component with
    a frequency connection point, and
    a signal connection point which serves as a signal input for a low-frequency input signal ($Tx_l$) in the frequency range below 60 GHz,
  at least one first transmitting antenna connected to the signal connection point for generating a high-frequency transmission signal ($Tx_h$) of up to more than 300 GHz,
  a resonant circuit connected to the frequency connection point, at least one first receiving antenna for receiving a high-frequency reception signal ($Rx_h$), wherein the receiving antenna is connected to a signal output for a low-frequency evaluation signal ($Rx_l$),
  at least one first non-linear semiconductor component for downconverting the high-frequency reception signal ($Rx_h$), wherein the semiconductor component is arranged between the first receiving antenna and a signal ground. In the simplest case, a (high-frequency) diode or an amplifier can, again, be used for this purpose.

In addition, an antenna arrangement (galvanically separated from the remaining components) is provided, which couples out the high-frequency transmission signal ($Tx_h$) in the direction of the measurement object and which couples the high-frequency reception signal ($Rx_h$) reflected by the measurement object at least into the first receiving antenna. With respect to the low-frequency input signal ($Tx_l$), it is advantageous if the resonant circuit is tuned to the frequency at the signal input.

The frequency converter circuit according to the invention thus uses the effect that, by means of the low-frequency input signal ($Tx_l$), corresponding harmonic waves are induced at the non-linear, high-frequency component. This results in the advantage that, on the one hand, a very-high-frequency radar transmission signal ($Tx_h$) can be produced and efficiently coupled out, wherein the carrier substrate of the circuit used (for example, the circuit board) does not have to be high-frequency-capable for this purpose. For example, with a low-frequency input signal ($Tx_l$) in the range of 5 GHz to 50 GHz and a frequency multiplication factor between 3 and 12 (which is set via the non-linear, high-frequency component and the resonant circuit), a frequency of the high-frequency transmission signal ($Tx_h$) in the range of up to 300 GHz or more can be achieved.

In addition to generating the high-frequency transmission signal ($Tx_h$), the high-frequency reception signal ($Rx_h$) is also downconverted into a low-frequency evaluation signal ($Rx_l$). This makes it possible for the distance (d) to be determined further on the basis of the more easily processable, low-frequency evaluation signal ($Rx_l$). In this case, the frequency converter circuit according to the invention can be used both in the pulse propagation method and in the FMCW method, so that the respective advantages of high radar frequencies can be used in both methods.

Any electrical component with a non-linear characteristic curve, e.g., a diode or an amplifier, can, in principle, be used as a non-linear, high-frequency component. Moreover, corresponding ceramics—in particular, magnesium oxide—also exhibit non-linear behavior, in terms of high-frequency technology. It is, however, in particular, advantageous if the non-linear, high-frequency component is a bipolar or FET transistor, having a base or gate connection point,
  a collector connection point or source connection point serving as a signal connection point, and
  an emitter or drain connection point serving as a frequency connection point.

Due to the rapid switching characteristic, it is appropriate for the transistor to be designed as a high-frequency transistor.

So that the base or gate connection point is not uncontacted, and interfering reflections in terms of high-frequency technology are thereby avoided, it is advantageous if this connection point is connected to a voltage source. In this case, it is particularly advantageous if this voltage source supplies the gate connection point with a supply voltage ($V_{bias}$) in such a way that the transistor operates in the saturation region.

In an advantageous extension of the frequency converter circuit according to the invention, the frequency converter circuit additionally comprises:

a second transmitting antenna, connected to the base or gate connection point, for additionally generating the high-frequency transmission signal ($Tx_h$),
  a second receiving antenna for additionally receiving the high-frequency reception signal ($Rx_h$), wherein the second receiving antenna is connected to the signal output, and
  a second non-linear semiconductor component arranged between the second receiving antenna and the signal ground.

In this embodiment variant, the effect is used that the corresponding harmonic waves for transmission can be tapped not only at the collector or source connection point, but also at the base or gate connection point, by the second transmitting antenna. In this case, the second receiving antenna serves to establish a symmetrical relationship between receiving and transmitting antennas. In this embodiment variant, the high-frequency transmission signal ($Tx_h$) and the high-frequency reception signal ($Rx_h$) can thus be coupled out or in more efficiently.

A central advantage of the frequency converter circuit according to the invention is that it can be arranged on a non-high-frequency-capable circuit board and, nevertheless, requires no complex waveguide technology. In particular, the transmitting and receiving antennas can be implemented very easily, when the circuit is arranged on a circuit board. The first transmitting antenna and/or at least the first receiving antenna can thus be designed as meander, spiral, or fractal antennas, or, in particular, as patch antennas.

In the event that the frequency converter circuit comprises a second transmitting antenna, the second transmitting antenna can be designed in such a way that it has a different transmission efficiency in comparison to the first transmitting antenna. This allows compensation for the effect that the transmission signal ($Tx_h$) is applied, where appropriate, with different powers respectively at the source connection point and at the gate connection point. With the same transmission efficiency of the two transmitting antennas, this would result in an asymmetrical emission of the radar transmission signal ($Tx_h$), i.e., a "squinting" of the antenna arrangement.

In addition to the transmitting and receiving antennas, the resonant circuit can also be realized as a conductor track, provided that the frequency converter circuit is constructed on a circuit board base; for example, the resonant circuit designed as a conductor track can be implemented rectilinearly and be connected to a via hole at least in one or, in particular, in both end regions. Separate capacitors and/or coils with, possibly, a very limited cutoff frequency are thus avoided.

The antenna arrangement, which is present in addition to the transmitting and receiving antennas, has the function of coupling out the high-frequency transmission signal ($Tx_h$) directed in the direction of the measurement object and, at the same time, efficiently coupling in the high-frequency reception signal ($Rx_h$), without additionally requiring a transmit/receive switch (or, alternatively, a separate transmitting and receiving antenna in each case). In order to implement this optimally, this antenna arrangement is therefore preferably to be implemented in such a way that it at least partially converts the high-frequency transmission signal ($Tx_h$), which is emitted at least by the first transmitting antenna, into another mode—in particular, the TE11 mode. Accordingly, the antenna arrangement must furthermore be designed such that it at least partially converts the high-frequency reception signal ($Rx_h$) reflected by the measurement object, in turn, into another mode—in particular, the TE22 mode.

The antenna arrangement can, for example, be constructed in the form of a modified horn antenna. In the case of a horn antenna, the mode conversion described above could be achieved by the horn antenna having a discontinuity of the increasing diameter, e.g., a corresponding constriction or widening, in one section. In this case, the alignment of the horn antenna would be approximately perpendicular to the surface of the circuit board, wherein it is, preferably, galvanically separated from the circuit board. Alternatively, the additional antenna arrangement could also be realized by two separate individual antennas, in which case, one respectively serves to transmit or receive.

A supplementary development of the frequency converter circuit according to the invention provides that the first receiving antenna have a first high-frequency coupling structure which is designed as a conductor track and connects to the source connection point. In the case where the frequency converter circuit comprises a second receiving antenna, the second receiving antenna can also have a second high-frequency coupling structure, designed as a conductor track, which connects to the gate connection point. In this case, the alignment of the coupling structures is preferably parallel to those conductor tracks which lead to the base or gate connection point, or to the collector or source connection point.

An additional individual amplification of the low-frequency reception signal ($Rx_l$) can be impressed by correspondingly designing these coupling structures. As an alternative to a connection of the receiving antenna(s) by means of a non-linear semiconductor component designed as a diode, as well as to the coupling structure, their function could alternatively also be achieved by a correspondingly-connected amplifier. In this case, the amplifier could be designed at low cost at the frequency of the low-frequency reception signal ($Rx_l$), wherein, again, the non-linear transmission behavior of the amplifier causes the high-frequency reception signal ($Rx_h$) to be downconverted.

In addition to the use in automotive or aviation applications, the frequency converter circuit according to the invention is particularly suitable for use in radar-based, fill-level measuring devices, since they can realize improved measuring accuracy and smaller antenna/antenna geometries (and thereby smaller dimensions of the fill-level measuring device overall), thanks to high radar frequencies. Accordingly, in the case of fill-level measurement, the measurement object is a surface of a filling material in a container, wherein the fill-level (L) of the filling material in the container is determined by means of the distance (d) between the fill-level measuring device and the surface.

BRIEF DESCRIPTION OF THE DRAWINGS

The invention is explained in more detail with reference to the following figures. Shown are.

DETAILED DESCRIPTION

Figure 1:
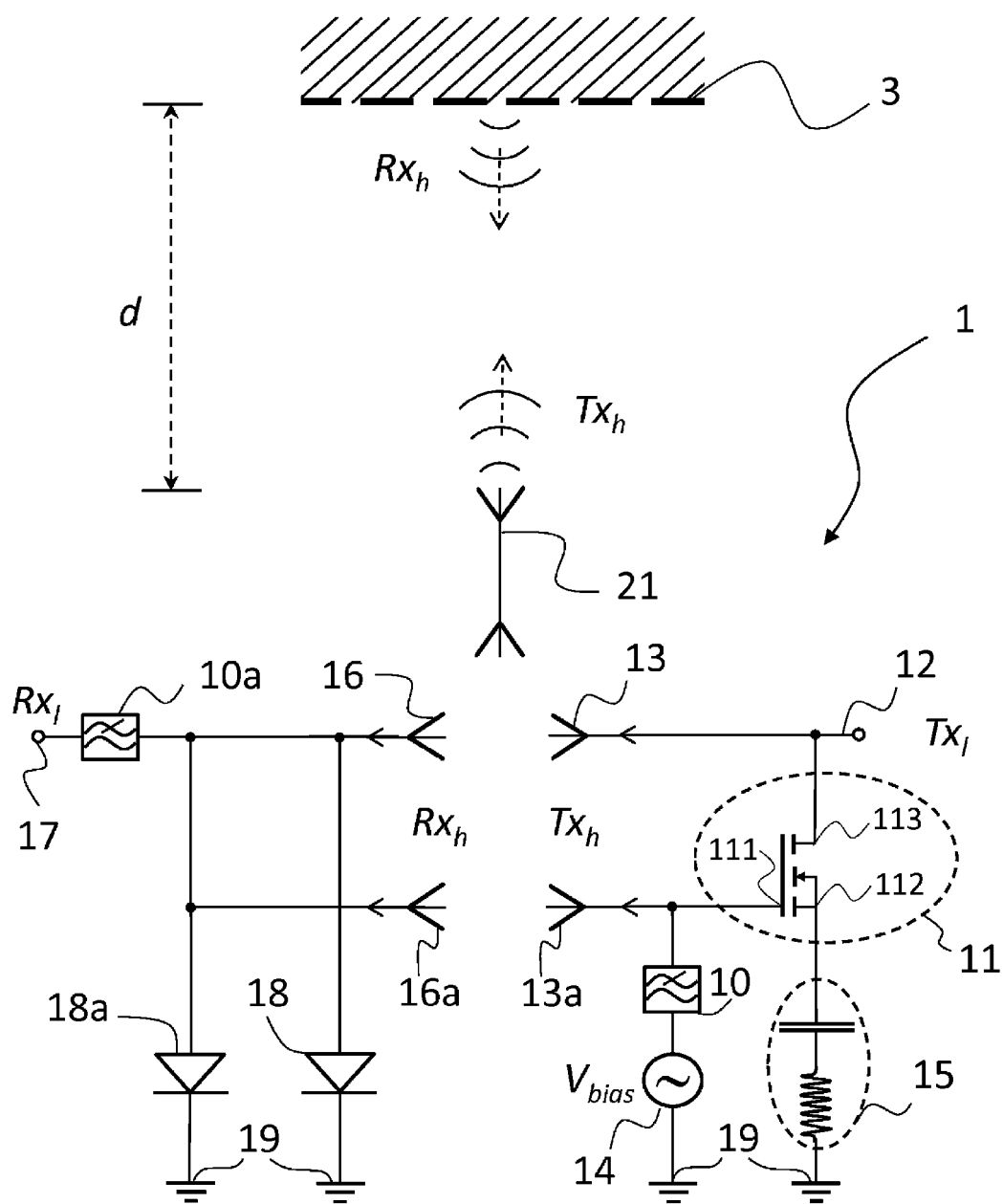
FIG. 1 shows an equivalent circuit diagram of the frequency converter circuit according to the invention.

FIG. 1 shows an electrical equivalent circuit diagram of a preferred embodiment variant of the frequency converter circuit 1 according to the invention. The core of the frequency converter circuit 1 is a non-linear, high-frequency component designed as an FET transistor 11 and having a source connection point 113, a drain connection point 112, and a gate connection point 111. The source connection point 113 is connected to a signal input 12. A low-frequency input signal $Tx_l$ is impressed on the transistor 11 via the signal input 12. A supply voltage $V_{bias}$ is impressed at the gate connection point 111 by means of a voltage source 14. The supply voltage is designed such that the transistor 11 operates in the saturation region. In order to prevent high-frequency signals from being fed back into the voltage source 14, a correspondingly-designed, first low-pass filter 10 is arranged between the voltage source 14 and the gate connection point 111. Connected to the drain connection point 112 is an LC resonant circuit 15 which is tuned to the frequency at the signal input 12.

As a result of the wiring of the transistor 11, the latter acts as a harmonic oscillator. In this case, the fundamental and harmonic frequencies can be tapped both at the source connection point 113 and at the gate connection point 111. In the embodiment shown, a transmitting antenna 13, 13a is therefore respectively connected both to the source connection point 113 and to the gate connection point 111. In this case, the two transmitting antennas 13, 13a are designed such that they suppress the low fundamental frequency, while the desired harmonic frequencies are emitted with high transmission efficiency. A high-frequency radar transmission signal $Tx_h$ is thus generated on the basis of the harmonic waves and emitted by the two transmitting antennas 13, 13a.

In order to be able to determine the distance d to a measurement object 3, or to determine the speed thereof, the transmission signal $Tx_h$ is coupled out in the direction towards the measurement object 3. This takes place via an additional antenna arrangement 21.

Due to the fact that a voltage is applied to the signal input 12 as a result of the input signal $Tx_l$, the frequency converter circuit 1 is supplied with energy. This can, for example, be used, with a corresponding design of the input signal $Tx_l$, as a pulsed sine signal, for example, so as to operate the transistor 11 in a clocked manner and to thus generate a clocked transmission signal $Tx_h$, as is required, in particular, in pulse propagation radar measurement methods.

In order to operate the frequency converter circuit 1 according to the invention in FMCW mode, it is, however, advantageous to impress a continuous sinusoidal low-frequency input signal $Tx_l$ which has a frequency ramp (also known as frequency deviation). In this case, the frequency ramp of the input signal $Tx_l$ is preferably to be selected such that its maximum frequency is higher than (in particular, twice as high as) the bandwidth of the resulting high-frequency transmission signal $Tx_h$.

The reception signal $Rx_h$, which is produced by reflection of the transmission signal $Tx_h$ at the surface of the measurement object 3, is also received via the antenna arrangement 21. The subsequent coupling of the reception signal $Rx_h$ into the frequency converter circuit 1 takes place via two receiving antennas 16, 16a.

According to the invention, the high-frequency reception signal $Tx_h$ is again downconverted, and a low-frequency evaluation signal $Rx_l$ is thus obtained. For this purpose, each of the two receiving antennas 16, 16a is respectively connected to signal ground 19 via a high-frequency diode 18, 18a. The downconversion of the high-frequency reception signal $Rx_h$ is effected in this case by the non-linear characteristic curve of the high-frequency diodes 18, 18a.

Since the function of the downconversion results from the non-linear behavior, instead of the diodes 18, 18a, any other electrical component having a correspondingly-non-linear IV characteristic curve could, alternatively also be used. The low-frequency evaluation signal $Rx_l$ thus obtained is provided for further processing by connecting the two receiving antennas 16, 16a to a signal output 17. In order to suppress the high-frequency reception signal $Rx_h$ at the signal output, a correspondingly-designed, low-pass filter 10a is connected upstream thereof. As an alternative to the low-pass filter 10a, a band-pass filter whose pass frequency is tuned to the low-frequency evaluation signal $Rx_l$ could also be used.

The embodiment variant illustrated in FIG. 1 thus results in the advantage according to the invention that, on the one hand, a very-high-frequency radar transmission signal $Tx_h$ can be generated and efficiently coupled out. In addition, the high-frequency reception signal $Rx_h$ is, however, also downconverted into the low-frequency evaluation signal $Rx_l$, whereby the further determination of the distance d can occur on the basis of the low-frequency evaluation signal $Rx_l$, which is more easily managed, and the high-frequency reception signal $Rx_h$ does not need to be transported over far, and thus lossy, line paths.

This is the basis for the further central advantage of the invention, viz., that the frequency converter circuit 1 can be realized on a circuit board base which does not have to be high-frequency-capable. An advantageous embodiment variant of the frequency converter circuit 1 shown in FIG. 1 on a circuit board 20 is therefore illustrated in FIG. 2. In this case, with respect to the conductor tracks and the substrate, circuit board technologies according to the prior art can be used.

Figure 2:
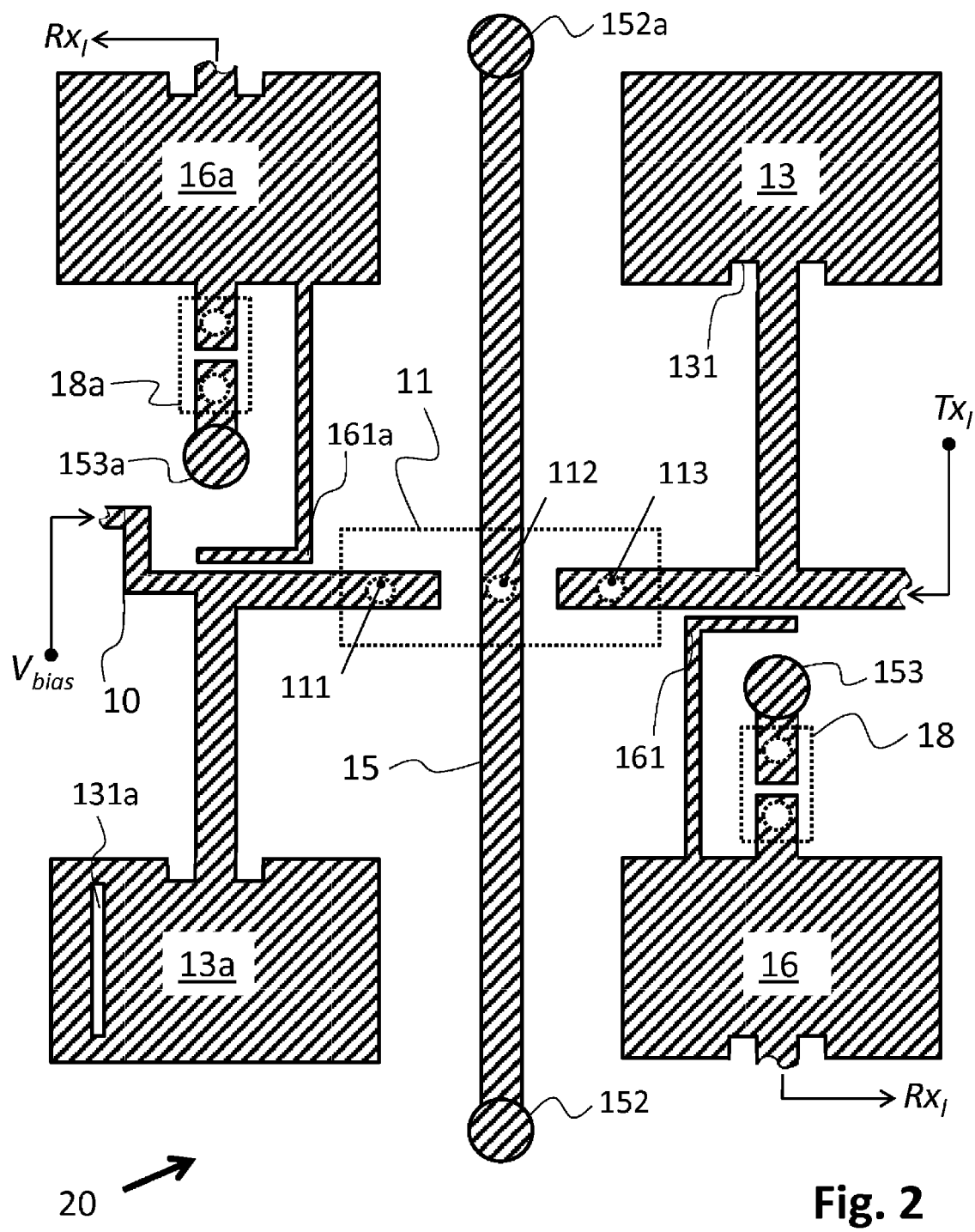
FIG. 2 shows an arrangement of the frequency converter circuit on a circuit board.

In the embodiment variant shown in FIG. 2, the transistor 11 forms the central element, around which the two transmitting antennas 13, 13*a* or the two receiving antennas 16, 16*a* are arranged, approximately symmetrically, in a quadrangle. In this case, the transmitting antennas 13, 13*a* and the receiving antennas 16, 16*a* are arranged diagonally opposite one another. The antennas 13, 13*a*, 16, 16*a* are realized as rectangular patch antennas which are located in the plane of the circuit board 20. The advantage of a planar design of the antennas 13, 13*a*, 16, 16*a* is that they can be attached to the circuit board 20 together with the conductor tracks in one process during manufacturing. Accordingly, the transmitting and receiving antennas 13, 13*a*, 16, 16*a* could, alternatively, also be designed as meander, spiral, or fractal antennas.

The shape of the transmitting and receiving antennas 13, 13*a*, 16, 16*a* shown in FIG. 2 is approximately square. The edge length of these patch antennas 13, 13*a*, 16, 16*a* is, in this case, dimensioned such that the transmission efficiency is optimized to the harmonic frequencies of the transistor 11 or of the resonant circuit 15, while the transmission efficiency at the fundamental frequency of the transistor 11 (which corresponds to the frequency of the low-frequency input signal $Tx_l$) is minimized.

The emission direction of the transmitting antennas 13, 13*a* is, per se, undirected, away from the circuit board 20. The directivity in the direction of the measurement object 3, which corresponds, in an approximately perpendicular course, to the surface of the circuit board 20, is first caused by the antenna arrangement 21 (not shown in FIG. 2 shown). In order to achieve this directivity (and to manage without additional use of a transmit/receive switch), it is advantageous if the antenna arrangement 21 converts the high-frequency transmission signal $Txh$ emitted by the two transmitting antennas 13, 13*a* into another mode—in particular, the TE11 mode. For this purpose, the antenna arrangement 21 is also to be designed such that it at least partially converts the high-frequency reception signal $Rx_h$, which is reflected by the measurement object 3, back into the mode originally emanating from the circuit board 20, viz., the TE22 mode.

Figure 3:
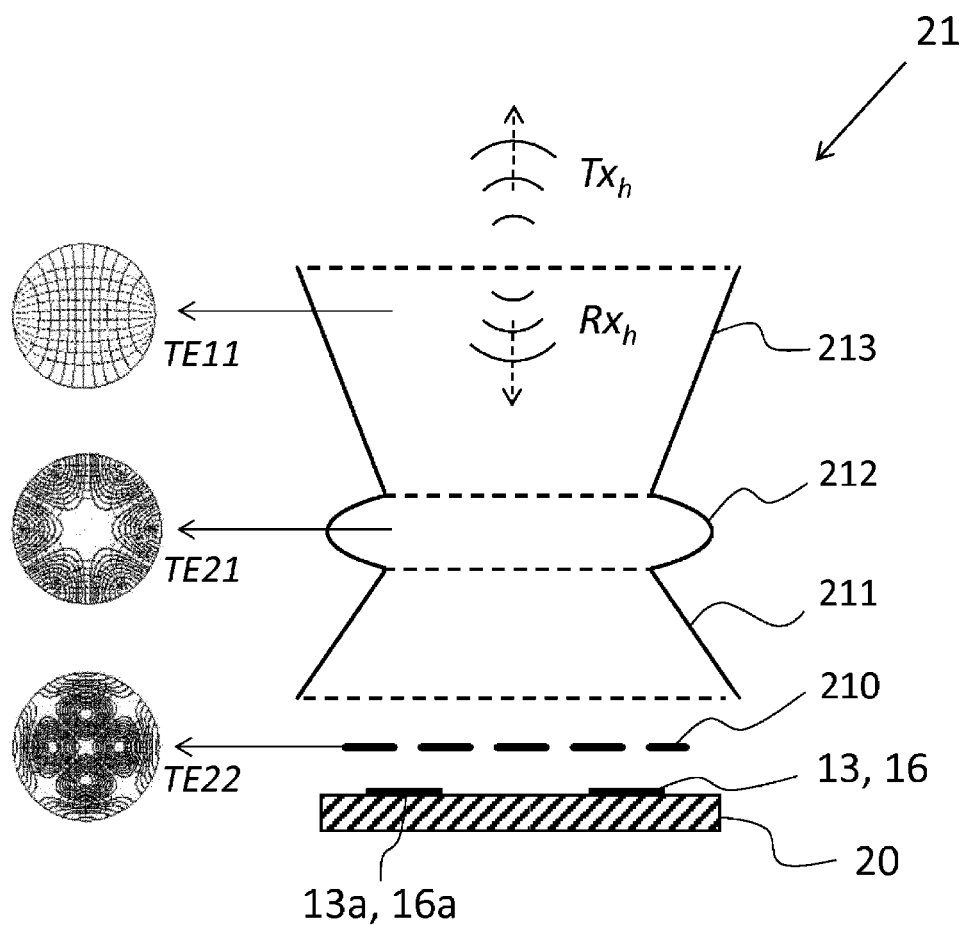
FIG. 3 shows an advantageous embodiment of the antenna arrangement of the frequency converter circuit.

An embodiment of the antenna arrangement 21 suitable for this purpose is shown in FIG. 3. As shown there, the antenna arrangement 21 may be constructed in, for example, the form of a modified horn antenna. The desired mode conversion is achieved in this embodiment variant in that the antenna arrangement 21 has a widening 212 (a correspondingly-dimensioned constriction would also be possible) in a section between a horn 213, directed toward the measurement object 3, and a funnel 211 directed toward the transmitting and receiving antennas 13, 13*a*, 16, 16*a*. In this case, the alignment of the antenna arrangement 21 is approximately perpendicular to the surface of the circuit board 20, wherein the antenna arrangement 21 is galvanically separated from the circuit board 20. In this case, an intermediate conversion of the transmission signal $Tx_h$ or of the reception signal $Rx_h$ into the TE21 mode takes place in the funnel 212 in each case.

The mode conversion in the antenna arrangement 21 is facilitated by the diagonally opposite arrangement of the transmitting antennas 13, 13*a* or of the receiving antennas 16, 16*a* on the circuit board 20. It is, furthermore, advantageous in this case if a galvanically-separated planar and metallically-conductive network structure 210 is additionally attached between the antenna arrangement 21. In this case, the network is preferably designed such that it splits into four segments, wherein each segment surrounds the base area of one of the patch antennas 13, 13*a*, 16, 16*a* in each case.

This embodiment variant of the antenna arrangement 21 additionally has the positive property that the lateral positioning of the antenna arrangement 21 above the circuit board 20, with respect to the antennas 13, 13*a*, 16, 16*a*, is comparatively non-critical.

A further design variant (not shown) of the antennas 13, 13*a*, 16, 16*a*, which is based upon the configuration shown in FIG. 2, consists in designing each individual antenna from, again, a composition of, respectively, four quadratically-arranged, partial patch antennas. They have the advantageous characteristic that they strongly suppress any signal components with frequencies far below the frequency of the low-frequency input signal $Tx_l$, and thus constitute an inherent filter against such interference signals.

As shown in FIG. 2, in contrast to the other antennas 13, 16, 16*a*, the second transmitting antenna 13*a* additionally has a first recess 131*a* in its surface interior. This leads to an artificial shortening of the transmitting antenna 13*a*, as a result of which it has a reduced transmission efficiency in comparison to the first transmitting antenna 13. This compensates for the effect that the high-frequency transmission signal $Tx_h$ is present more strongly, in practice, at gate 111 than at source 113. Without this compensation, this would lead to a "squinted" transmission characteristic.

In the case of the exemplary embodiment of the frequency converter circuit 1 according to the invention shown in FIG. 2, not only the antennas 13, 13*a*, 16, 16*a* are produced analogously to the conductor track structures on the circuit board 20. The resonant circuit 15 is also designed in the form of a rectilinear conductor track, wherein the transistor 11 is arranged approximately centrally, in relation to the two end regions 152, 152*a* of the resonant circuit 15. The conductor-track-like resonant circuit 15 is designed, in terms of width, such that it functions capacitively with respect to the base impedance of the transistor 11 (in practice, between 45 ohm and 80 ohm). The end regions 152, 152*a* of the conductor track are via holes 152, 152*a* to the signal ground 19 (which is generally formed in a lower layer of the circuit board 20, either over the entire area or at least as a structured conductor track layer). On the one hand, the via holes 152, 152*a* contribute at least one inductive component to the resonant circuit 15. On the other hand, the via to the signal ground increases the capacitive effect of the conductor-track-shaped resonant circuit 15.

In the embodiment variant shown in FIG. 2, the diodes 18, 18*a* are arranged directly at the respective receiving antenna 16, 16*a* so as to minimize the line losses of the high-frequency reception signal $Rx_h$. In this case, it depends upon the design of the frequency converter circuit 1 as a whole whether a connection of the diodes 18, 18*a* in the forward or reverse direction is advantageous.

In the exemplary embodiment shown, they have a recess 131 on both sides of the respective conductor track at those points of the patch antennas 13, 13a, 16, 16a at which they are electrically contacted via conductor tracks. As a result, the patch antennas 13, 13a, 16, 16a can be designed to be more compact overall in terms of area, without impairing the efficiency. Furthermore, as a result, they become more insensitive to the interfering influences by the respective feeding conductor tracks.

In the embodiment variant shown in FIG. 2, in parallel connection to the diodes 18, 18a, the receiving antennas 16, 16a have two HF coupling structures 161, 161a which in turn connect in the form of conductor track structures to the receiving antennas 16, 16a; a first coupling structure 161 of the first receiving antenna 16 in this case couples to the source connection point 113. The second coupling structure 161a of the second receiving antenna 16a couples to the gate connection point 111.

The alignment of the coupling structures 161, 161a in this case runs in parallel to the corresponding conductor tracks leading to the gate connection point 111 or to the source connection point 113. By means of the coupling structures 161, 161a, a low-frequency component is respectively coupled into the receiving antennas 16, 16a. In addition to the downconversion of the high-frequency reception signal $Rx_h$, this simultaneously enables the low-frequency evaluation signal $Rx_l$ to be amplified. As an alternative to the diodes 18, 18a and the coupling structures 161, 161a, these two functions (downconversion and amplification) could also be achieved by an amplifier connected appropriately to the respective receiving antenna 16, 16a.

An implementation of the filter 10, in terms of high-frequency technology, is also possible on the basis of a conductor track structure. As shown in FIG. 2, the filter 10 is realized as an angled and constricted conductor track structure, which prevents transmission of high-frequency signals.

Figure 4:
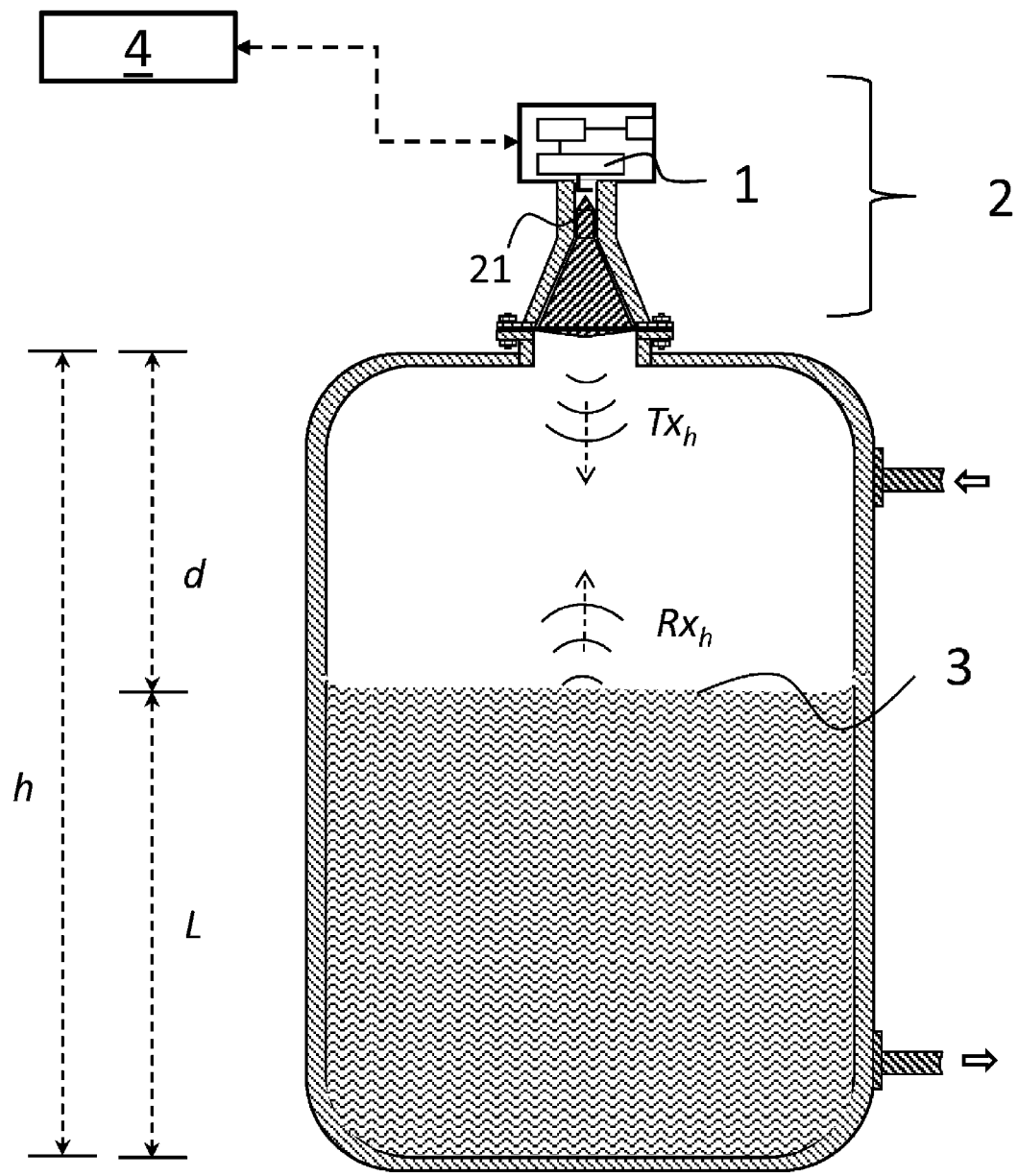
FIG. 4 shows a use of the frequency converter circuit in a fill-level measuring device.

A possible application of the frequency converter circuit 1 according to the invention in a fill-level measuring device 2 is illustrated in FIG. 4; it shows a typical arrangement of a fill-level measuring device 2 operating according to the pulse propagation or FMCW principle on a container. In the container is a filling material 3, the fill-level L of which is to be determined by the fill-level measuring device 3. For this purpose, the fill-level measuring device 2 is mounted on the container at a previously known installation height h, above the filling material 3. The container can be up to more than 30 m high, depending upon the application.

The fill-level measuring device 2 is arranged on the container in such a way that it emits the high-frequency transmission signal $Tx_h$ in the direction of the surface of the filling material 3. After reflection at the filling material surface, the high-frequency reception signal $Rx_h$ is received by the antenna unit 21 of the frequency converter circuit 1. The propagation time between emission of the transmission signal $Tx_h$ and reception of the reception signal $Rx_h$ depends in this case upon the distance d=h−L to the filling material surface. In the case of fill-level measuring devices according to the prior art, the fill-level L is calculated on the basis of the measured propagation time. In the case of the invention, the propagation time, and thus the fill-level, can be based upon the low-frequency reception signal $Rx_l$ so that the fill-level measuring device does not have to have further high-frequency assemblies in addition to the frequency converter circuit 1.

In general, the fill-level measuring device 2 is connected via a bus system, such as "PROFIBUS," "HART," or "Wireless HART," to a superordinate unit 4—for example, a process control system. In this case, the determined fill-level L could, for example, be communicated, in order to control any inflows and outflows present on the container.

The invention claimed is:

1. A frequency converter circuit for a radar-based measuring device, comprising:
    a non-linear, high-frequency component having a frequency connection point and a signal connection point, wherein the signal connection point serves as a signal input for a low-frequency input signal;
    a first transmitting antenna connected to the signal connection point for generating a high-frequency transmission signal;
    a resonant circuit connected to the frequency connection point;
    a first receiving antenna for receiving a high-frequency reception signal, wherein the first receiving antenna is connected to a signal output for a low-frequency evaluation signal;
    a first non-linear semiconductor component arranged between the first receiving antenna and a signal ground; and
    an antenna arrangement embodied to couple out the high-frequency transmission signal in the direction of a measurement object and to couple in the high-frequency reception signal reflected by the measurement object into the first receiving antenna,
    wherein the radar-based measuring device is configured to determine a distance to a measurement object or a speed of the measurement object.

2. The frequency converter circuit according to claim 1, wherein the non-linear, high-frequency component is an FET transistor having a gate connection point, a source connection point serving as the signal connection point, and a drain connection point serving as the frequency connection point.

3. The frequency converter circuit according to claim 2, further comprising:
    a voltage source connected to the gate connection point.

4. The frequency converter circuit according to claim 3, wherein the voltage source is configured to supply the gate connection point with a supply voltage such that the FET transistor operates in the saturation region.

5. The frequency converter circuit according to claim 2, further comprising:
    a second transmitting antenna, connected to the gate connection point, for generating the high-frequency transmission signal;
    a second receiving antenna for receiving the high-frequency reception signal, wherein the second receiving antenna is connected to the signal output; and
    a second non-linear semiconductor component arranged between the second receiving antenna and the signal ground.

6. The frequency converter circuit according to claim 5, further comprising:
    a circuit board, wherein the non-linear, high-frequency component, the first transmitting antenna, the resonant circuit, the first receiving antenna, and the first non-linear semiconductor component are disposed on the circuit board.

7. The frequency converter circuit according to claim 6, wherein the first transmitting antenna, the second transmitting antenna, the first receiving antenna, and the second receiving antenna are designed as patch antennae.

8. The frequency converter circuit according to claim 7, wherein the second transmitting antenna is designed such that it has a different transmission efficiency in comparison to the first transmitting antenna.

9. The frequency converter circuit according to claim 6, wherein the resonant circuit is designed as a conductor track.

10. The frequency converter circuit according to claim 9, wherein the resonant circuit designed as a conductor track that runs rectilinearly and is connected to a via hole at least in one end region.

11. The frequency converter circuit according to claim 6, wherein the first receiving antenna has a first high-frequency coupling structure designed as a conductor track that connects to the source connection point, and
    wherein the second receiving antenna has a second high-frequency coupling structure designed as a conductor track that connects to the gate connection point.

12. The frequency converter circuit according to claim 5, wherein the antenna arrangement is configured to convert the high-frequency transmission signal emitted by the first transmitting antenna and the second transmitting antenna into a TE11 mode, and
    wherein the antenna arrangement is further configured to convert the high-frequency reception signal, which is reflected by the measurement object, into a TE22 mode.

13. The frequency converter circuit according to claim 5, wherein the first non-linear semiconductor component and the second non-linear semiconductor component are high-frequency diodes.

14. The frequency converter circuit according to claim 1, wherein the resonant circuit is tuned to the frequency at the signal input.

15. The frequency converter circuit according to claim 1, wherein the non-linear, high-frequency component is a high-frequency transistor.

16. The frequency converter circuit according to claim 1, wherein the measurement object is a surface of a filling material in a container, and wherein the fill-level of the filling material in the container is determined by the distance.

\* \* \* \* \*